US008529105B2

(12) United States Patent
Calon et al.

(10) Patent No.: US 8,529,105 B2
(45) Date of Patent: Sep. 10, 2013

(54) REMOTE COOLING BY COMBINING HEAT PIPE AND RESONATOR FOR SYNTHETIC JET COOLING

(75) Inventors: Georges Marie Calon, Eindhoven (NL); Ronaldus Maria Aarts, Geldrop (NL); Peter Alexander Wachters, Helmond (NL); Antonius Adrianus Maria Marinus, Eindhoven (NL); Reinhold Elferich, Aachen (DE); Hugo Johan Cornelissen, Waalre (NL); Clemens Johannes Maria Lasance, Nuenen (NL)

(73) Assignee: Koninklijke Philips N.V., Eindhoven (NL)

( * ) Notice: Subject to any disclaimer, the term of this patent is extended or adjusted under 35 U.S.C. 154(b) by 333 days.

(21) Appl. No.: 13/002,511

(22) PCT Filed: Jun. 25, 2009

(86) PCT No.: PCT/IB2009/052745
§ 371 (c)(1),
(2), (4) Date: Jan. 4, 2011

(87) PCT Pub. No.: WO2010/004469
PCT Pub. Date: Jan. 14, 2010

(65) Prior Publication Data
US 2011/0110108 A1 May 12, 2011

(30) Foreign Application Priority Data
Jul. 10, 2008 (EP) .................................... 08104703

(51) Int. Cl.
*F21V 29/02* (2006.01)
*F28D 15/04* (2006.01)
(52) U.S. Cl.
USPC ....................... 362/373; 362/294; 165/104.26

(58) Field of Classification Search
USPC .............................. 362/294, 373; 165/104.26
See application file for complete search history.

(56) References Cited

U.S. PATENT DOCUMENTS

| 7,438,440 | B2 * | 10/2008 | Dorogi .......................... 362/294 |
| 7,606,029 | B2 * | 10/2009 | Mahalingam et al. ........ 361/700 |
| 8,066,410 | B2 * | 11/2011 | Booth et al. ................... 362/294 |
| 8,069,910 | B2 * | 12/2011 | Beltran et al. ................ 165/121 |
| 8,240,885 | B2 * | 8/2012 | Miller ........................... 362/294 |
| 2007/0096118 | A1 | 5/2007 | Mahalingam et al. |
| 2007/0119575 | A1 | 5/2007 | Glezer et al. |
| 2007/0127210 | A1 | 6/2007 | Mahalingam et al. |
| 2007/0147046 | A1 | 6/2007 | Arik et al. |

FOREIGN PATENT DOCUMENTS

| JP | 2007087765 A | 4/2007 |
| WO | 2008048493 A2 | 4/2008 |
| WO | 2008117211 A1 | 10/2008 |
| WO | 2009072406 A1 | 6/2009 |

\* cited by examiner

*Primary Examiner* — Stephen F Husar
*Assistant Examiner* — James Cranson, Jr.
(74) *Attorney, Agent, or Firm* — John F. Salazar; Mark L. Beloborodov

(57) ABSTRACT

This invention relates to thermal management for removing heat generated by a heat source (110). This is done by a combination of a heat conducting member (120), which is thermally connected to the heat source in one end and to a remotely arranged heat sink (130) in the opposite end, and a synthetic jet actuator (140). The synthetic jet actuator is arranged to provide active cooling directly onto the heat source by generating and directing an air flow towards the heat source. The synthetic jet actuator comprises a resonator cavity housing (150) and an oscillating member (160). The oscillator member is arranged at least partly inside said resonator cavity. The combination of the heat conducting member and the synthetic jet actuator provides a highly efficient cooling.

13 Claims, 3 Drawing Sheets

REMOTE COOLING BY COMBINING HEAT PIPE AND RESONATOR FOR SYNTHETIC JET COOLING

FIELD OF THE INVENTION

The present invention relates to thermal management systems and more particularly to thermal management systems for providing remote cooling by means of a combination of a heat conducting member and a synthetic jet actuator.

BACKGROUND OF THE INVENTION

Traditionally thermal management systems have typically been based on forced convective cooling, alone or in combination with a heat sink. Early prior art suffer from problems like bulkiness of the parts contained in the system, mechanically complicated structures, moving parts etc. More recently thermal management systems utilizing cooling by means of synthetic jet actuators and heat pipes have become common for different types of heat sources.

A synthetic jet actuator utilizes a synthetic jet to influence the air flow over a body. Typically a synthetic jet actuator comprises a housing defining a resonator cavity. An orifice is present in the wall of the housing. The synthetic jet further comprises an oscillating member arranged in or about the resonator cavity housing for periodically generating synthetic jet streams, i.e. an oscillating air stream that is projected in an external environment out from the orifice of the housing. The oscillating member may be a loudspeaker, a movable piston, or a flexible diaphragm as a wall of the housing. The flexible diaphragm is typically actuated by a piezoelectric actuator or other appropriate means. The air stream provides a highly efficient cooling at a specific position determined by the orifice.

A heat pipe is generally a vacuum tight device comprising a working fluid and housing. The heat pipe works with a two-phase change process which is driven by a temperature difference between a cooler condenser part of the housing and a warmer evaporator part of the housing. Heat input at the evaporator part of the housing of the heat pipe vaporizes the liquid working fluid. The vapour then flows towards a cooler condenser part of the housing, the vapour condenses and the latent heat of vaporization carried in the vapour gives up its latent heat. The condensed liquid returns to the evaporator part of the housing by capillary action or gravity, or a combination thereof.

It is known to combine heat pipes and synthetic jet actuators in thermal management systems. The US Patent Application Publication No. US 2007/0127210 A1 discloses a thermal management system which comprises a plurality of heat sources thermally connected to a remotely arranged heat exchanger via heat pipes. The heat exchanger comprises a plurality of heat fins which are exposed to a fluidic flow, which fluidic flow through the heat exchanger is augmented with a synthetic jet actuator.

It is desirable to provide thermal management systems that further addresses less complicated installation, efficient heat transport, bulkiness and degree of complexity of the system during manufacturing, mounting and operation.

SUMMARY OF THE INVENTION

It is an object of the present inventive concept to provide an alternative and improved system for thermal management of a heat source. Furthermore, it is an object to provide a luminaire device utilizing thermal management according to the present inventive concept.

This object is achieved by a thermal management system according to the present invention as defined in claim 1. Furthermore, the object is achieved by a luminaire device with corresponding thermal management according to the present invention as defined in claim 10.

The invention is based on the insight that thermal management of a heat source is efficiently provided by means of a combined heat conductor and air stream cooling structure, and thereby allowing a remote placement of a heat sink, which heat sink in addition can be reduced in size as compared to a traditional heat sink solution due to the highly efficient cooling structure.

Thus, in accordance with an aspect of the present invention, a thermal management system is provided for removing heat generated by a heat source. The system comprises a heat sink, which is remotely arranged from the heat source, a heat conducting member which is arranged to provide thermal communication between the heat source and the heat sink, and a synthetic jet actuator. The synthetic jet actuator comprises a resonator cavity housing and an oscillating member arranged at least partly inside the resonator cavity housing. The oscillating member is further arranged to generate an air flow. A first orifice is arranged in the resonator cavity housing to direct at least a subpart of the generated air flow towards the heat source.

Thus, a thermal management system is provided having the heat sink remotely arranged, and which is cooled by combining a heat conducting member and a synthetic jet actuator arranged to cool the heat source in an active way, as compared to natural convection cooling. This is advantageous since the heat sink for a high power heat source is often bulky which limits the freedom of design for the heat source system itself and for the surrounding environment in a building or the like.

Furthermore, the combined cooling by means of a heat conducting member and synthetic jet actuator for generating an air flow towards the heat source and or heat sink provides a highly efficient system for removing heat even for high power heat sources. Thus, the heat sink of the system may be reduced in size as compared to prior art solutions. Furthermore, the system has low mechanical complexity and is space-saving as compared to traditional piping etc.

In accordance with an embodiment of the system, the heat conducting member is a heat pipe, which provides the benefit of being able to transport large quantities of heat even when driven by a small difference in temperature between heat source and the remote heat sink.

In accordance with an embodiment of the system, the resonator cavity housing is a pipe resonator tube which is coaxially arranged to enclose the heat conducting member. This provides a number of benefits. The arrangement provides an advantageous solution for installation of the system for thermal management of the heat sources, thus only one combined heat conducting structure, comprising of the heat conducting member and the pipe resonator tube in a single integrated part, has to be applied to the heat source and the heat sink. Furthermore, the arrangement is space-saving. The coaxially arranged pipe resonator also provides an extra protection around the heat conducting member as it acts as a shield from the environment.

In accordance with an embodiment of the system, a second orifice directed towards the heat sink is arranged in the resonator cavity housing to direct a subpart of the generated air flow towards the heat sink. Thus, the heat sink is further cooled.

In accordance with an embodiment of the system, the synthetic jet actuator is arranged such that the subparts of the air flow directed towards the heat source and the heat sink, respectively, are in acoustical phase.

In accordance with an embodiment of the system, the synthetic jet actuator is arranged such that the subparts of the air flow directed towards the heat source and the heat sink, respectively, are in acoustical anti-phase. To be in acoustical anti-phase is advantageous with respect to the noise level, because both coherent noise sources (noise created at the respective orifices) in the system will cancel each other.

In accordance with an embodiment of the system, the heat conducting member is flexible, which allows for flexibility of the positioning of the heat source itself. Having a flexible heat conducting member applied to the heat source, the heat source may be repositioned a predetermined distance and angle in space, and is furthermore allowed to be rotatable arranged. A flexible heat conducting member allows for real-time repositioning of the heat source.

In accordance with an embodiment of the system, the pipe resonator tube is flexible. A flexible pipe resonator tube allows for repositioning of the installation of the thermal connection between the heat source and the heat sink, in addition to or instead of repositioning of the heat source around the end of the pipe resonator tube that is positioned closest to the heat source.

In accordance with an embodiment of the system, the heat source is a luminaire which provides for flexible luminaire arrangements while providing highly efficient thermal management even for high power luminaires.

In accordance with a second aspect of the present invention, there is provided a luminaire device comprising a light unit, a heat sink remotely arranged from the light unit, a heat transport member comprising a heat conducting member arranged to provide thermal communication between the light unit and the heat sink, and a synthetic jet actuator comprising a resonator cavity housing and an oscillating member arranged at least partly inside the resonator cavity housing to generate an air flow. A first orifice is arranged in the resonator cavity housing to direct at least a subpart of the generated air flow towards the light unit.

Thus, a luminaire device is provided in which the cooling of a light unit is conveniently arranged by combining a remote heat sink, to which the light unit is thermally connected via the heat conducting member, and a synthetic jet actuator, which generated air flow is directed towards the light unit, i.e. the heat source. The advantages of the luminaire device are the same as previously described for the system for thermal management in accordance with the present inventive concept.

In accordance with an embodiment of the device, the heat conducting member is a heat pipe, and the resonator cavity housing is a pipe resonator tube which is coaxially arranged to enclose the heat pipe.

In accordance with an embodiment of the system, the heat conducting member and the pipe resonator tube are flexible.

In accordance with an embodiment of the system, the at least one light unit is rotatably arranged.

In accordance with an embodiment of the system, the system further comprises an actuation device for adjusting the direction of lighting.

In accordance with an embodiment of the system, a second orifice is arranged in the resonator cavity housing to direct at least a subpart of the air flow towards the remote heat sink.

Thus, the current invention provides a luminaire device having a thermal management that allows for a remote positioning of the heat sink (e.g. a passive heat sink) with respect to the light unit, i.e. the heat sink is distanced from the actual light unit of the luminaire device.

Furthermore, an increased degree of freedom is provided for the lighting designer by an embodiment applying flexible heat pipes. Flexible heat pipes provide for allowing the light unit to be mounted at different positions, e.g. for adapting the installation to the actual environment the luminaire is to be installed in. Also, if the mounting position for a light unit has to be changed due to reconstruction of e.g. the ventilation installation, the flexible heat pipe arrangement is advantageous. Flexible heat pipes also allow for creating a thermal connection that transports heat around other objects.

Furthermore the flexible heat pipes allows for a real time rearrangement of the light unit, which is advantageous in e.g. a light tracking system for spot lights as used in a theatrical performance.

In accordance with an alternative embodiment of the system according to the present invention, the heat pipe is a loop heat pipe.

In accordance with an alternative embodiment of the system according to the present invention, the heat sink further comprises a pump for pumping fluid bodies inside the at least one heat pipe.

In accordance with an alternative embodiment of the system according to the present invention, the pipe resonator tube is arranged having at least one orifice arranged to direct at least a part of the air flow in any predetermined direction.

In accordance with an alternative embodiment of the device according to the present invention, the light unit comprises at least one light emitting diode.

In accordance with an alternative embodiment of the system according to the present invention, a plurality of heat sources, e.g. light units, are connected to a single remote heat sink.

These and other aspects, features, and advantages of the invention will be apparent from and elucidated with reference to the embodiments described hereinafter.

BRIEF DESCRIPTION OF THE DRAWINGS

The invention will now be described in more detail and with reference to the appended drawings in which.

DESCRIPTION OF PREFERRED EMBODIMENTS

Figure 1:
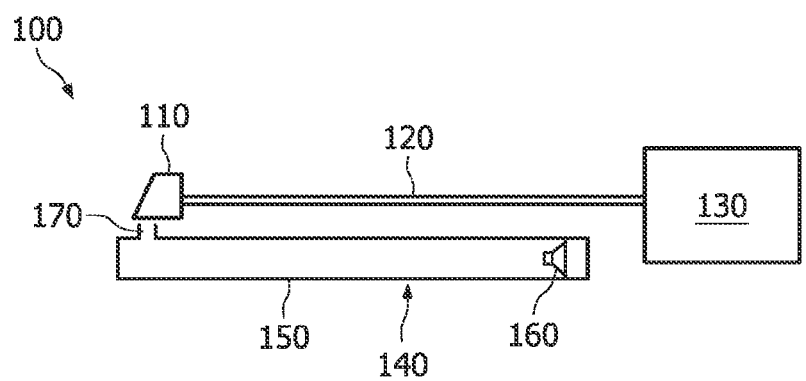
FIG. 1 is a schematic illustration showing a cross-sectional view of an embodiment of a system in accordance with the present invention.

An exemplifying embodiment of a thermal management system in accordance with the present invention is described herein under and with reference to FIG. 1. The thermal management system 100 for removing heat generated by a heat source 110 comprises a heat conducting member 120, a heat sink 130 which is positioned remotely from the heat source 110, and a synthetic jet actuator 140. It should be mentioned that the term heat source, as used in this document, may include the actual heat generating body in combination with a heat source housing (not shown) or similar. A thermal connect is arranged between the heat source 110 and the heat sink 130 by means of the heat conducting member 120. The heat conducting member 120 is thus arranged to provide thermal communication between the heat source 110 and the heat sink 130. The heat conducting member 120 is preferably constructed from a high-thermal conductivity material, e.g. copper, aluminum, magnesium, or an alloy, but can in case of heat pipes be made from plastics, e.g. silicone with or without brading.

The heat sink 130 may be realized in a number of different ways. The most common heat sink device comprises a metal body which is often provided with fins to increase the cooling area of the body. The size and weight of a heat sink is related to the cooling technology and is maximum in case of free convection. The cooling performance of the heat sink 130 can be significantly improved. This is typically done by e.g. applying liquid cooling, forced convection by applying a common fan, thermo electrical cooling including Peltier elements, and any combination thereof.

Furthermore, the synthetic jet actuator 140 for generating an air flow and directing the airflow towards the heat source 110 in combination with the heat conducting member 120 provides a highly efficient heat removing capability to the system. The synthetic jet actuator 140 is a device comprising at least of a resonator cavity housing 150 and an oscillating member 160, which device generates an air flow, also called a synthetic jet, by periodic forcing of air in the resonator cavity housing 150 by means of the oscillating member 160. The oscillating member can be a piston or a membrane. The oscillating member 160 may be a loudspeaker membrane which is controlled electromagnetically. To achieve maximum performance the frequency of the applied field should be controlled.

The resonator cavity housing 150 is arranged having a first orifice 170. The resonator cavity housing 150 is arranged such that the first orifice 170 is opened towards the heat source 110, thereby providing at least a part of the air stream created by the oscillating member towards the heat source 110. The shape and size of the cavity 150, the viscosity of the gas (air), the frequency of the oscillation of the oscillating member 160, the positioning of the oscillating member, the position of the first orifice are factors which have to be matched or tuned in to achieve a predetermined air stream.

In an embodiment of the system according to the present invention the resonator cavity housing 150 is shaped like a tube, and forms a pipe resonator tube 150. (However, the resonator cavity housing may alternatively be shaped in an eligible shape). The oscillating member 160 is arranged inside the pipe resonator tube 150. The pipe resonator tube 150 can be part of a structure, e.g. if the heat source is a luminaire, the pipe resonator tube 150 can be part of the support for the luminaire.

In accordance with an embodiment of the system, the heat conducting member 120 is a heat pipe. A heat pipe is generally a vacuum tight device comprising a working fluid and housing. The heat pipe works with a two-phase change process which is driven by a temperature difference between a cooler condenser part of the housing and a warmer evaporator part of the housing. Heat input at the evaporator part of the housing of the heat pipe vaporizes the liquid working fluid. The vapour then flows towards a cooler condenser part of the housing, the vapour condenses and the latent heat of vaporization carried in the vapour gives up its latent heat. The condensed liquid returns to the evaporator part of the housing by capillary action or gravity, or a combination thereof.

The heat pipe can be constructed of plastic with or without brading. The heat pipe is commonly shaped as a tube. However, to fit a specific application heat pipes can be made into annular and planar constructions. It is common to use water as working fluid. Water is suitable for temperatures between 20° C. and 250° C. Other working fluids which are suitable for lower temperatures are methanol, ethane, propylene, ammonia, nitrogen, oxygen and hydrogen. Higher temperature applications utilize alkali metals such as cesium, potassium, lithium and sodium.

Figure 2:
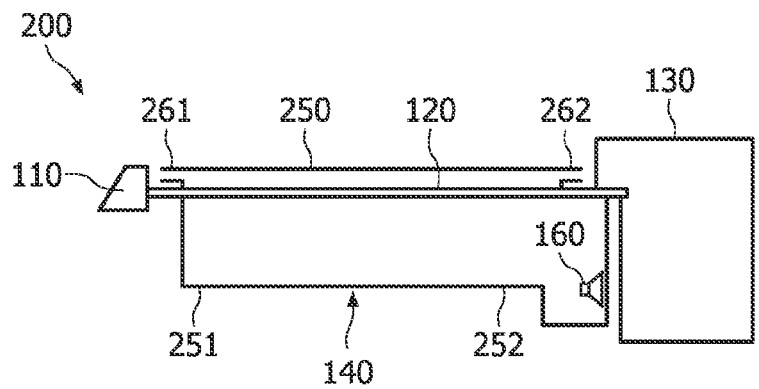
FIG. 2 is a schematic illustration showing a cross-sectional view of an embodiment of a system in accordance with the present invention.

In an embodiment of the system in accordance with the present invention, and as illustrated schematically in FIG. 2, the heat conducting member 120 which is providing the thermal connection between the heat source 110 and the heat sink 130 is arranged inside the resonator cavity housing 250. The shapes of the heat conducting member 120 and the resonator cavity housing 250 are here tubular. However, other shapes are possible and are to be regarded as falling within the scope of the present invention.

The resonator cavity housing is here forming a pipe resonator tube 250 which is coaxially arranged to enclose the heat conducting member 120. The proportion between the resonator cavity housing 250 and the heat conducting member 120 is chosen to provide enough free space around the heat conducting member 120 to create a resonator volume for the oscillating member 160. Thus, the resonator cavity housing 250 and the heat conducting member 120 are combined such that a single integrated part of the thermal management system 200 provides two cooling functions. By integrating the heat conducting member 210 and the synthetic jet actuator 250 into one single integrated part a simplified installation of the system is achieved as the integrated part only has to be applied to the heat source 110 in one end and the heat sink 130 in the other end. It should be mentioned that the pipe resonator tube 250 and the heat conducting member 120 does not have to be exactly coaxially arranged.

In the above embodiment, and as illustrated in FIG. 2, the resonator cavity housing 250 is a pipe resonator tube having a first orifice 261 arranged in a first end of the pipe resonator tube 251. The first end 251 is arranged at the heat source 110. Here, the pipe resonator tube 250 forms a closed end at the first end 251 with the exception of the first orifice 261 which forms a small opening in the first end 251.

In an alternative embodiment, the pipe resonator tube 250 forms an open end at the first end 252. Thus, the first orifice 261 is the entire open end of the pipe resonator tube 250.

A second orifice 262 is arranged at a second end of the pipe resonator tube 252. The second orifice 262 is directed towards the heat sink 130.

Here, also the oscillating member 160 is arranged at the second end of the pipe resonator tube 252. When the oscillating member 160 is actuated active cooling is achieved both at the heat source 110, which is subjected to an air stream provided at the first orifice 261, and at the heat sink, which is subjected to an air stream provided at the second orifice 262. For a resonating frequency and a predetermined length of the pipe resonator tube 250, the air streams provided at the first orifice 261 and at the second orifice 262 are in acoustical phase.

Figure 3:
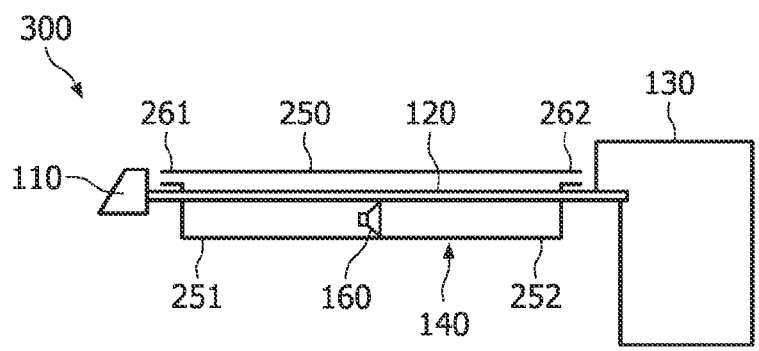
FIG. 3 is a schematic illustration showing a cross-sectional view of an embodiment of a system in accordance with the present invention.

In FIG. 3, an embodiment of the system 300 is illustrated in which the oscillating member 160 is a loudspeaker device which is arranged at the middle of the pipe resonator tube 250. The front cone of the loudspeaker 160 is oriented towards the heat sink 130, while the back of the loudspeaker 160 is oriented towards the heat source 110. Now, the air stream provided at the first orifice 261 and the air stream provided at the second orifice 262 are pulsating in acoustical anti-phase which is beneficial with respect to the noise level, because both coherent noise sources will cancel each other.

Continuing now with the embodiment wherein the oscillating member 160 is a loudspeaker device. There are numerous ways of arranging the loudspeaker inside or partly outside the pipe resonator tube 250. Often one part of the loudspeaker is arranged outside the pipe resonator tube 250, e.g. when the loudspeaker is bigger than the tube diameter.

In an alternative embodiment of the system the membrane, i.e. the same side as the cone of the loudspeaker 160, is arranged inside the pipe resonator tube 250 while the back of the loudspeaker 160 is arranged in free space or in a closed volume.

In an alternative embodiment of the system when having two orifices 261, 262 in the pipe resonator tube 250, two tubes emanate from both ends of the pipe resonator tube.

In an alternative embodiment of the system the combination of the heat conducting member and the pipe resonator tube is folded.

Figure 4A:
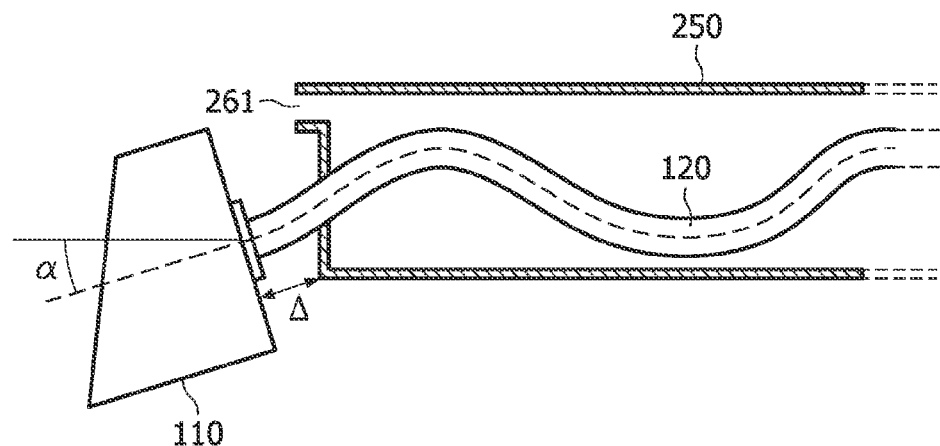
FIG. 4 is a schematic illustration showing a cross-sectional view of an embodiment of a system in accordance with the present invention.

In an embodiment of the system in accordance with the present invention, and as illustrated in FIG. 4a), having a basic construction as described for the embodiments above, the heat conducting member 120 is flexible. The flexibility of the heat conducting member provides several degrees of freedom for the mounting of the heat source 110. In one aspect the flexibility of the heat conducting member 120 allows for an adjustable position of the heat source 110 with respect to the distance Δ from the first end of the pipe resonator tube 251, and further it allows for a freedom in what angle α with respect to the pipe resonator tube 250 the heat source 110 is directed.

Figure 4B:
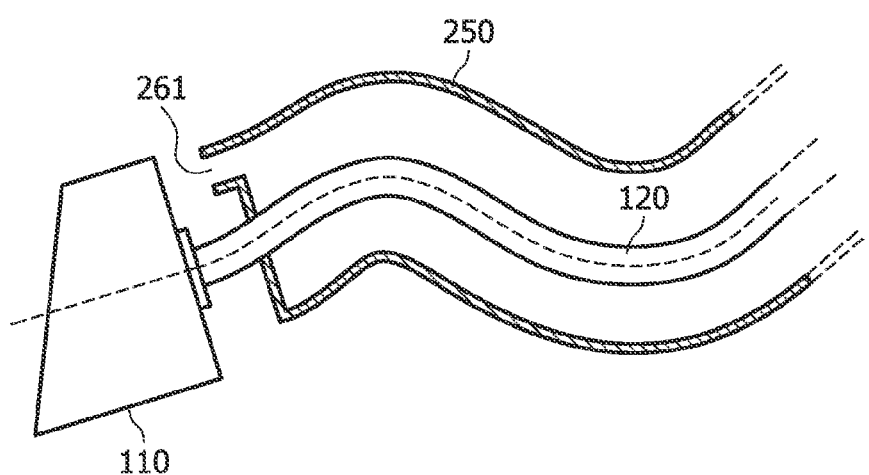

In accordance with an embodiment of the system, as illustrated in FIG. 4b) the pipe resonator tube 250 is flexible. The flexible pipe resonator tube 250 provides for an additional freedom of the positioning of the heat source with respect to distance and direction from the heat source.

Figure 5A:
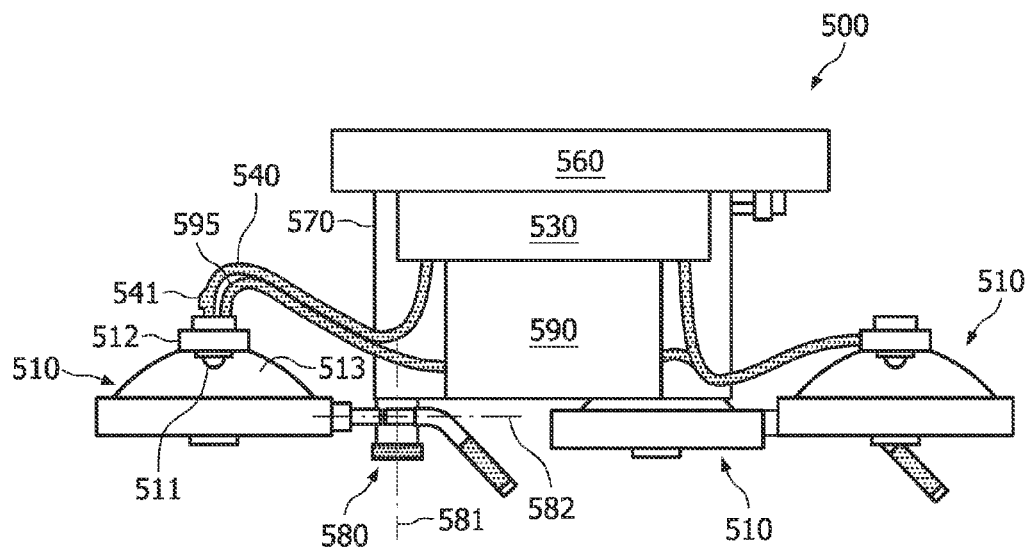
FIG. 5 is a side view of an exemplifying embodiment of a luminaire device according to the present invention.

The second aspect of the present inventive concept provides a luminaire device. An exemplifying embodiment is illustrated in FIG. 5 in which a side view of a luminaire device according to the present invention is presented. The above described inventive concept of thermal management of a heat source is here utilized in a luminaire device 500.

In the exemplifying embodiment the luminaire device 500 comprises a plurality of main heat sources. More particularly there are three light units 510 which are all arranged in thermal connection with a heat sink 530 via a corresponding heat transport member 540. (It is given that the luminaire device may comprise only one light unit 510.)

The heat sink 530 is remotely arranged from the light units 510. The cooling effect in the heat sink 530 may be completely passive and only spread the heat to the support structure 570 forming a sink, which may therefore be equipped with fins.

In an alternative embodiment the heat sink 530 also comprises a pump (not shown) to improve the heat transfer. This is advantageous e.g. in the case of wall or floor mountings.

Figure 5B:
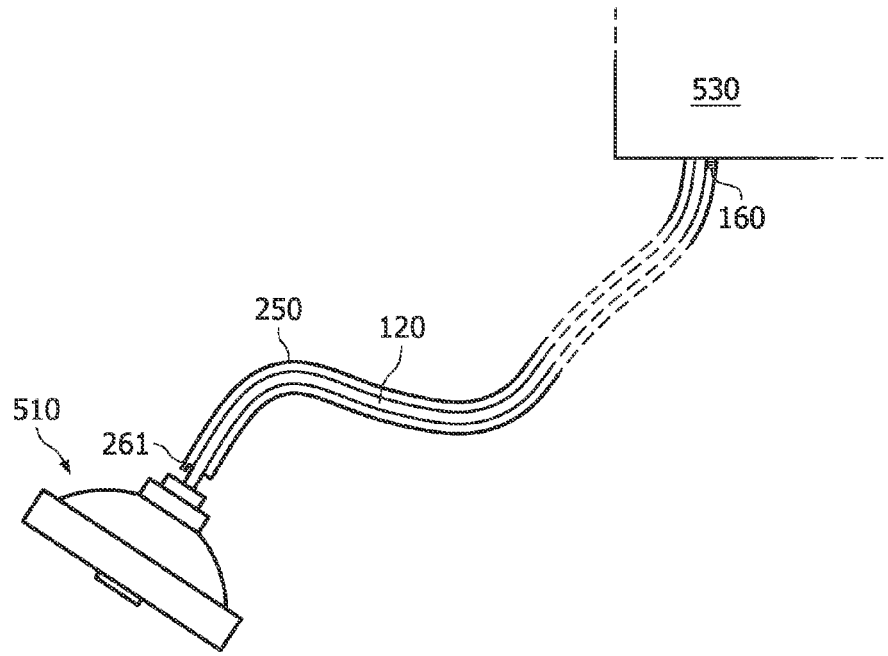

A close up of the heat transport member 540 is illustrated in FIG. 5b). Each heat transport member 540 comprises an elongated heat conducting member 120, which in one end is engaged with or attached to its corresponding light unit 510 and in the opposite end is engaged with or attached to the heat sink 530, and a synthetic jet actuator 140. The synthetic jet actuator 140 comprises a resonator cavity housing formed in a pipe resonator tube 250 and an oscillating member 160 which is arranged inside the resonator cavity housing. Furthermore, there is a first orifice 261 arranged in the resonator cavity housing formed by the pipe resonator tube 250, which first orifice 261 is arranged to direct at least a subpart of an air flow generated by the oscillating member 160 towards the light unit. The heat conducting member 120 can be arranged utilising a heat pipe.

The pipe resonator tube 250 is coaxially arranged to enclose the heat conducting member 120. As in the thermal management system described above an alternative embodiment of the luminaire device may be arranged having a second orifice 262, see FIG. 2, arranged to direct a subpart of the generated air flow towards the heat sink 530. In this embodiment the heat sink 530 thus comprises a combination of sink and forced convection means.

In this exemplifying embodiment of the luminaire device the light units 510 are rotatably arranged. The light units 510 each comprises light emitting diodes, LEDs, 511 mounted to a spreader/evaporator means 512, and secondary optics 513, which here comprises a parabolic reflector. Due to the moderate temperatures which is achievable with the present inventive thermal management system, even for high power LED lighting, the secondary optics in the form of light guides is conceivable. The light units 510 are rotatable and are connected to a supporting member 570 via joints 580 with axes 581 and 582. The light units 510 may be rotated around the vertical axis 580 and tilted around the horizontal axis 581. The adjustment of the light units 510 are here adjusted around the axes 581, 582 manually. However, an electrical control by means of an actuation device 560 of the adjustment may be implemented in the luminaire device. Also the degree of freedom for the positioning and allowed lighting directions of a respective light unit may be fitted to the actual lighting application by the individual design of the joints.

The actuation device 560 is part of an stationary assembly of the luminaire device 500. The stationary assembly comprises the actuation device 560, the heat sink 530, the electrical driver 590, and the support structure 570 (e.g. the housing of the stationary assembly). The actuation device 560 may be arranged to control the light units 510 electrically, mechanically and thermally.

Furthermore, the light units 510 are electrically connected to a lamp driver 590 via an electrical connect 595.

Luminaire devices in accordance with the present inventive concept are suitable to utilize in adjustable projectors or spotlight systems. They are well suited for LED-system light units. Loss power to be removed from such LED-based light units may be between 5 W and 100 W. By utilizing LEDs instead of halogen or HID lamps IR and UV radiation can be avoided.

In an embodiment of the luminaire device 500, the heat conducting member 120 comprises a heat pipe comprising two pipes to arrange for a loop pipe in order to obtain a higher heat flux at a given temperature drop between the light units 510 and the stationary assembly (560, 530, 570,590).

In an alternative embodiment the electrical driver 590 is thermally connected to the heat sink 530.

Above, embodiments of the system and device according to the present invention as defined in the appended claims have been described. These should be seen as merely non-limiting examples. As understood by a skilled person, many modifications and alternative embodiments are possible within the scope of the invention.

It is to be noted, that for the purposes of this application, and in particular with regard to the appended claims, the word "comprising" does not exclude other elements or steps, that the word "a" or "an", does not exclude a plurality, which per se will be apparent to a person skilled in the art.

The invention claimed is:

1. A thermal management system for removing heat generated by a heat source said system comprising:
 a heat sink disposed remotely from said heat source;
 a heat conducting member for providing thermal communication between said heat source and said heat sink; and
 a synthetic jet actuator comprising
  a resonator cavity housing defining a first orifice; and
  an oscillating member disposed at least partly inside said resonator cavity housing and configured to generate an air flow, wherein at least a first portion of the generated air flow is directed towards said heat source via said first orifice, wherein said resonator cavity housing defines a second orifice generally oriented towards said heat sink such that at least a second portion of said generated air flow is directed towards said heat sink.

2. A system according to claim 1, wherein said heat conducting member is a heat pipe.

3. A system according to claim 1, wherein said resonator cavity housing is a pipe resonator tube which is coaxially arranged to enclose said heat conducting member.

4. A system according to claim 3, wherein said pipe resonator tube is flexible.

5. A system according to claim 1, wherein said synthetic jet actuator is arranged such that the first and second portions of said air flow directed towards said heat source and said heat sink, respectively, are in acoustical phase.

6. A system according to claim 1, wherein said synthetic jet actuator is arranged such that the first and second portions of said air flow directed towards said heat source and said heat sink, respectively, are in acoustical anti-phase.

7. A system according to claim 1, wherein said heat conducting member is flexible.

8. A system according to claim 1, wherein said heat source is a luminaire.

9. A luminaire device comprising:
 a light unit;
 a heat sink disposed remotely from said light unit;
 a heat transport member comprising
  a heat conducting member for providing thermal communication between said light nit and said heat sink, and
  a synthetic jet actuator comprising
   a resonator cavity housing defining a first orifice; and
   an oscillating member disposed at least partly inside said resonator cavity housing to generate an air flow, wherein at least a portion of said generated air flow is directed towards said light unit, wherein said heat conducting member is a heat pipe, and said resonator cavity housing is a pipe resonator tube which is coaxially arranged to enclose said heat pipe.

10. A device according to claim 9, wherein said heat conducting member and said pipe resonator tube are flexible.

11. A device according to claim 10, wherein said light unit is rotatably arranged.

12. A device according to claim 10, further comprising an actuation device for adjusting the direction of lighting from said light unit.

13. A device according to claim 9, wherein said resonator cavity housing defines a second orifice arranged to direct at least a second portion of said air flow towards said heat sink.

* * * * *